(12) United States Patent
Murasato et al.

(10) Patent No.: US 11,187,977 B2
(45) Date of Patent: Nov. 30, 2021

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventors: Naoki Murasato, Utsunomiya (JP); Ken Minoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 169 days.

(21) Appl. No.: 16/130,298

(22) Filed: Sep. 13, 2018

(65) Prior Publication Data
US 2019/0086796 A1 Mar. 21, 2019

(30) Foreign Application Priority Data
Sep. 19, 2017 (JP) .............................. JP2017-179008

(51) Int. Cl.
*G03F 7/00* (2006.01)
*G02B 27/09* (2006.01)
(Continued)

(52) U.S. Cl.
CPC ....... *G03F 7/0002* (2013.01); *G02B 27/0955* (2013.01); *G03F 7/70758* (2013.01); *H01L 21/02345* (2013.01)

(58) Field of Classification Search
CPC .............................. B29C 59/02; G03F 7/0002
See application file for complete search history.

(56) References Cited

U.S. PATENT DOCUMENTS 2,073,798 A * 3/1937 Hillman ................ G03B 33/00
352/45
4,712,910 A * 12/1987 Sakato .................. G03F 7/7055
257/E21.211
(Continued)

FOREIGN PATENT DOCUMENTS

JP 2015149450 A * 8/2015
JP 2016058735 A * 4/2016
(Continued)

OTHER PUBLICATIONS

Office Action issued in Korean Appln. No. 10-2018-0107756 dated Feb. 16, 2021. English translation provided.

*Primary Examiner* — Joseph S Del Sole
*Assistant Examiner* — Jerzi H Moreno Hernandez
(74) *Attorney, Agent, or Firm* — Rossi, Kimms & McDowell LLP

(57) ABSTRACT

An imprint apparatus cures an imprint material on a shot region of a substrate by light irradiation and forms a pattern on the shot region in a state in which a mold is in contact with the imprint material. The apparatus includes a shutter mechanism including a shutter plate configured to control light irradiation to the imprint material on the shot region and an actuator configured to drive the shutter plate, and a driving mechanism configured to change relative positions of the substrate and the mold. The shutter plate includes a first passing portion configured to irradiate a part out of a whole of the imprint material on the shot region with light and a second passing portion configured to irradiate the whole of the imprint material on the shot region.

16 Claims, 10 Drawing Sheets

(51) Int. Cl.
  *G03F 7/20* (2006.01)
  *H01L 21/02* (2006.01)

(56) References Cited

U.S. PATENT DOCUMENTS

| | | | | |
|---|---|---|---|---|
| 2005/0212156 A1* | 9/2005 | Tokita | ................... | G03F 7/0002 |
| | | | | 264/1.36 |
| 2007/0035056 A1* | 2/2007 | Suehira | ............... | B29C 35/0288 |
| | | | | 264/40.1 |
| 2009/0224436 A1* | 9/2009 | Mikami | ................. | B82Y 10/00 |
| | | | | 264/447 |
| 2011/0267595 A1* | 11/2011 | Mori | ................... | G03F 7/70066 |
| | | | | 355/67 |
| 2014/0117587 A1* | 5/2014 | Aoya | ...................... | B29C 59/02 |
| | | | | 264/403 |
| 2015/0221501 A1* | 8/2015 | Tsuji | .................... | G03F 7/0002 |
| | | | | 264/447 |
| 2019/0202091 A1* | 7/2019 | Takahashi | ............... | G02B 26/02 |

FOREIGN PATENT DOCUMENTS

JP    2016058735 A    4/2016
KR    1020140013957 A    2/2014

* cited by examiner

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus cures an imprint material on a shot region of a substrate by light irradiation and forms a pattern on the shot region in a state in which a mold is in contact with the imprint material. In the imprint apparatus, the shot region and the mold can be aligned in a state in which the mold and the imprint material on the shot region are in contact with each other. This alignment can be performed while detecting an alignment error between the mold and the shot region of the substrate by an alignment scope.

If viscoelasticity of the imprint material is high, the substrate and the mold are set in a coupled state by the imprint material. A vibration of the substrate is transmitted to the mold via the imprint material, and a vibration of the mold is transmitted to the substrate via the imprint material. Therefore, if the viscoelasticity of the imprint material is high, alignment between the mold and the shot region of the substrate is performed easily. On the other hand, if the viscoelasticity of the imprint material is low, the substrate and the mold can vibrate independently of each other. This may make it difficult to perform alignment between the mold and the shot region of the substrate, lowering an alignment accuracy.

Japanese Patent Laid-Open No. 2016-058735 describes an imprint apparatus that increases viscoelasticity of an imprint material by irradiating the whole of the imprint material with light having a different wavelength band or intensity from light which cures the imprint material, and then aligns a substrate and a mold.

If the viscoelasticity of the imprint material is increased by irradiating the whole of the imprint material with light, a filling property of the imprint material with respect to a concave portion that forms a pattern of the mold may be decreased in the whole area of a pattern region of the mold. Consequently, a waiting time until filling of the concave portion that forms the pattern of the mold with the imprint material is complete may become long, decreasing throughput.

SUMMARY OF THE INVENTION

One of aspects of the present invention provides an imprint apparatus that cures an imprint material on a shot region of a substrate by light irradiation and forms a pattern on the shot region in a state in which a mold is in contact with the imprint material, the apparatus comprising: a shutter mechanism including a shutter plate configured to control light irradiation to the imprint material on the shot region and an actuator configured to drive the shutter plate; and a driving mechanism configured to change relative positions of the substrate and the mold, wherein the shutter plate includes a first passing portion configured to irradiate a part out of a whole of the imprint material on the shot region with light and a second passing portion configured to irradiate the whole of the imprint material on the shot region.

The present invention provides a technique advantageous in improving throughput while improving an alignment accuracy.

Further features of the present invention will become apparent from the following description of exemplary embodiments with reference to the attached drawings.

DESCRIPTION OF THE EMBODIMENTS

The present invention will now be described with reference to the accompanying drawings by way of an exemplary embodiment.

Figure 1:
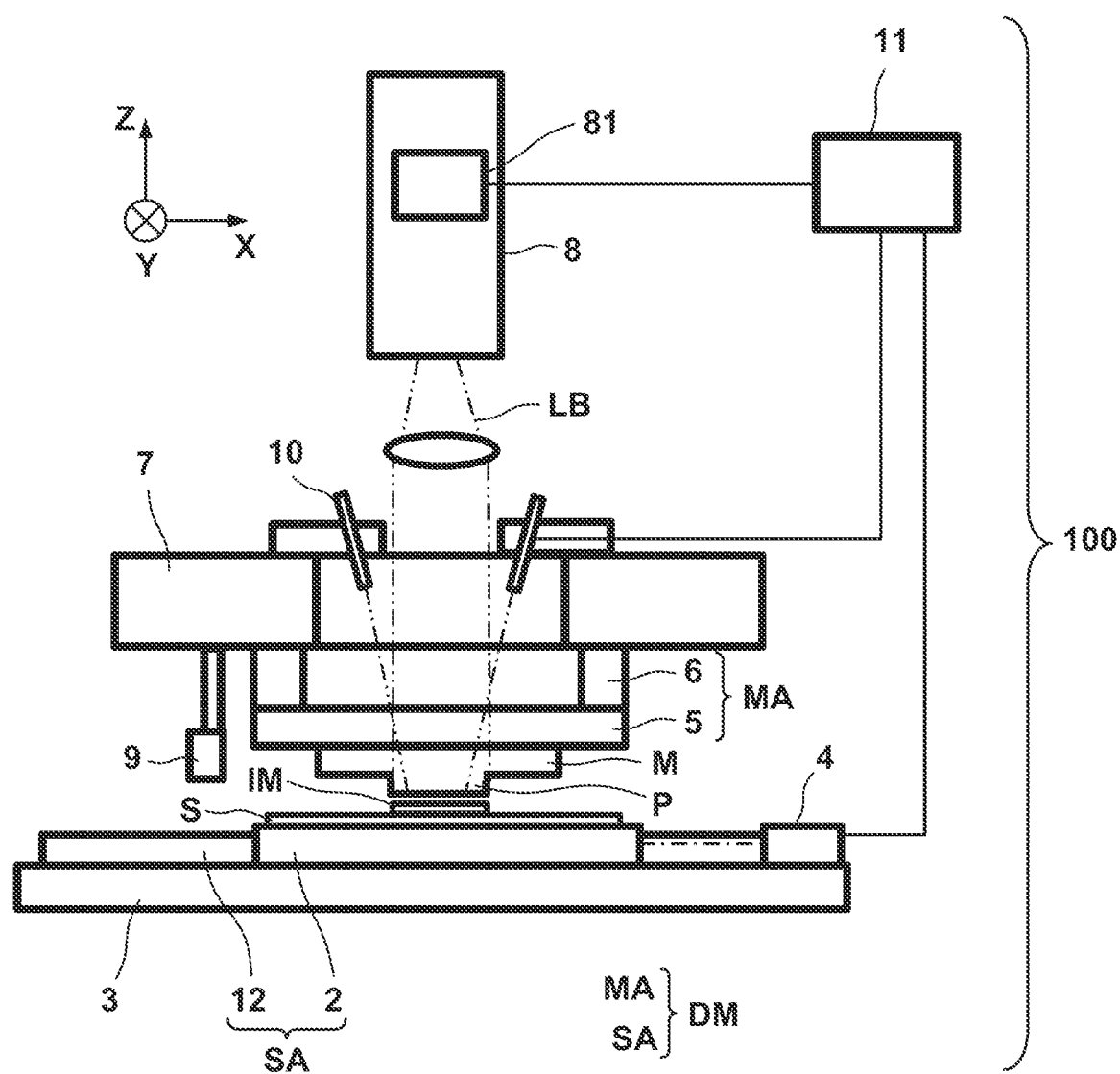
FIG. 1 is a view showing the arrangement of an imprint apparatus according to an embodiment of the present invention.

FIG. 1 shows the arrangement of an imprint apparatus 100 according to an embodiment of the present invention. The imprint apparatus 100 cures an imprint material IM on a shot region of a substrate S by light irradiation and forms a pattern on the shot region in a state in which a mold M (a pattern portion P thereof) is in contact with the imprint material IM.

A photo-curable composition (to be sometimes referred to as an uncured resin hereinafter) that is cured by light irradiation is used as the imprint material. The light can have a wavelength which falls within, for example, a range of 10 nm (inclusive) to 1 mm (inclusive) and can be, for example, infrared light, visible light, or ultraviolet light, or the like. The photo-curable composition contains at least a polymerizable compound and a photopolymerization initiator, and may further contain a non-polymerizable compound or solvent, as needed. The non-polymerizable compound is at least a material selected from the group consisting of a sensitizer, a hydrogen donor, an internal mold release agent, a surfactant, an antioxidant, a polymer component, and the like. The imprint material can be arranged on the substrate in a droplet-like shape, or an island-like shape or a film-like shape formed by a plurality of droplets connected to each other. The viscosity (viscosity at 25° C.) of the imprint material can fall within, for example, a range of 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed. For example, a silicon wafer, a compound semiconductor wafer, silica glass, or the like is used as the substrate.

In this specification and the accompanying drawings, directions are shown in an X-Y-Z coordinate system in which a direction parallel to the surface of the substrate S forms an X-Y plane. Let X, Y, and Z directions be directions parallel to X-, Y-, and Z-axes in the X-Y-Z coordinate system, respectively. Let θX, θY, and θZ be rotation about the X-axis, rotation about the Y-axis, and rotation about the Z-axis, respectively. Control or driving operations with respect to the X-, Y-, and Z-axes indicate control or driving operations with respect to the directions parallel to the X-, Y-, and Z-axes, respectively. Furthermore, control or driving operations with respect to θX-, θY-, and θZ-axes indicate control or driving operations with respect to rotation about an axis parallel to the X-axis, rotation about an axis parallel to the Y-axis, and rotation about an axis parallel to the Z-axis, respectively. A position is information that can be specified based on coordinates on the X-, Y-, and Z-axes. An orientation is information that can be specified by values on the θX-, θY-, and θZ-axes. Positioning indicates control of the position and/or orientation. Alignment can include control of the position and/or orientation of at least one of the substrate and the mold.

The imprint apparatus 100 includes a relative driving mechanism DM that changes relative positions of the mold M and the substrate S (a shot region thereof). The relative driving mechanism DM can include a substrate positioning mechanism SA that holds and positions the substrate S, and a mold positioning mechanism MA that holds and positions the mold M. The relative driving mechanism DM drives at least one of the substrate S and the mold M such that the relative positions of the substrate S and the mold M are changed. A change in relative positions by the relative driving mechanism DM can include contact of the mold M with the imprint material IM on the substrate S, driving for separating the mold M from the cured imprint material (a pattern of a cured product), and alignment between the mold M and the shot region of the substrate S.

The substrate positioning mechanism SA can include a substrate stage 2 that includes a substrate chuck for holding the substrate S, a substrate driving mechanism 12 that drives the substrate S by driving the substrate stage 2, and a sensor 4 that detects the position and orientation of the substrate stage 2. The substrate driving mechanism 12 is supported by a base frame 3. The mold positioning mechanism MA can include a mold holding unit 5 that holds the mold M and a mold driving mechanism 6 that drives the mold M by driving the mold holding unit 5. The mold driving mechanism 6 can be supported by a support 7.

The substrate driving mechanism 12 can be configured to drive the substrate S with respect to a plurality of axes (for example, three axes of the X-, Y-, and θZ-axes, preferably six axes of the X-, Y-, Z-, θX-, θY-, and θZ-axes). The mold driving mechanism 6 can be configured to drive the mold M with respect to a plurality of axes (for example, three axes of the Z-, θX-, and θY-axes, preferably six axes of the X-, Y-, Z-, θX-, θY-, and θZ-axes). The sensor 4 can include, for example, a laser interferometer or an encoder.

The imprint apparatus 100 further includes a curing unit 8 (light irradiation unit) that cures the imprint material IM on the shot region of the substrate S. The curing unit 8 cures the imprint material IM by irradiating the imprint material IM on the shot region of the substrate S with light after the completion of alignment between the shot region and the mold M (the pattern portion P thereof) in a state in which the imprint material IM and the mold M are in contact with each other. Consequently, a pattern made of a cured product of the imprint material IM is formed on the substrate S. In addition, the curing unit 8 also performs a process of irradiating a part (preceding exposure portion) of the imprint material IM on the shot region of the substrate S with light after the imprint material IM on the shot region and the mold M (the pattern portion P thereof) contact each other, and increasing viscoelasticity of the part. The details of the curing unit 8 will be described later.

The imprint apparatus 100 can further include a dispenser 9 that arranges the imprint material IM on the shot region of the substrate S. Note that the imprint apparatus 100 can be configured to perform an imprint process on one shot region each time the dispenser 9 arranges the imprint material IM in the shot region. Alternatively, the imprint apparatus 100 may be configured to perform the imprint process on each of a plurality of shot regions after the dispenser 9 arranges the imprint material IM in the plurality of shot regions. Alternatively, the dispenser 9 may be arranged as an external apparatus of the imprint apparatus 100. In this case, the substrate S where the imprint material is arranged by the dispenser 9 serving as the external apparatus is provided to the imprint apparatus 100.

The imprint apparatus 100 can further include an alignment scope 10. The alignment scope 10 detects, for example, a relative position of an alignment mark on the shot region of the substrate S and an alignment mark on the mold M. This makes it possible to detect a relative positional shift (alignment error) between the mold M and the shot region of the substrate S. Alignment between the mold M and the shot region of the substrate S can be performed by adjusting the relative position of the substrate S and the mold M with the relative driving mechanism DM while detecting the relative positional shift between the shot region and the mold M by the alignment scope 10.

The imprint apparatus 100 can further include a controller 11. The controller 11 controls the above-described respective constituent elements of the imprint apparatus 100. The controller 11 can be formed by, for example, PLD (short for Programmable Logic Device) such as an FPGA (short for Field Programmable Gate Array), an ASIC (short for Application Specific Integrated Circuit), a general-purpose computer with a program installed, or a combination of all or some of them.

The substrate S positioned by the substrate positioning mechanism SA and the mold M positioned by the mold positioning mechanism MA can vibrate independently upon receiving an external vibration or a vibration generated in the imprint apparatus 100. This is because of insufficient rigidity of structures (such as the substrate positioning mechanism SA, the mold positioning mechanism MA, the support 7, and the like) between the substrate S and the mold. Therefore, a relative positional shift (relative vibration) may exist between the substrate S and the mold M, and further between the shot region and the mold M to be aligned.

Figure 2A:
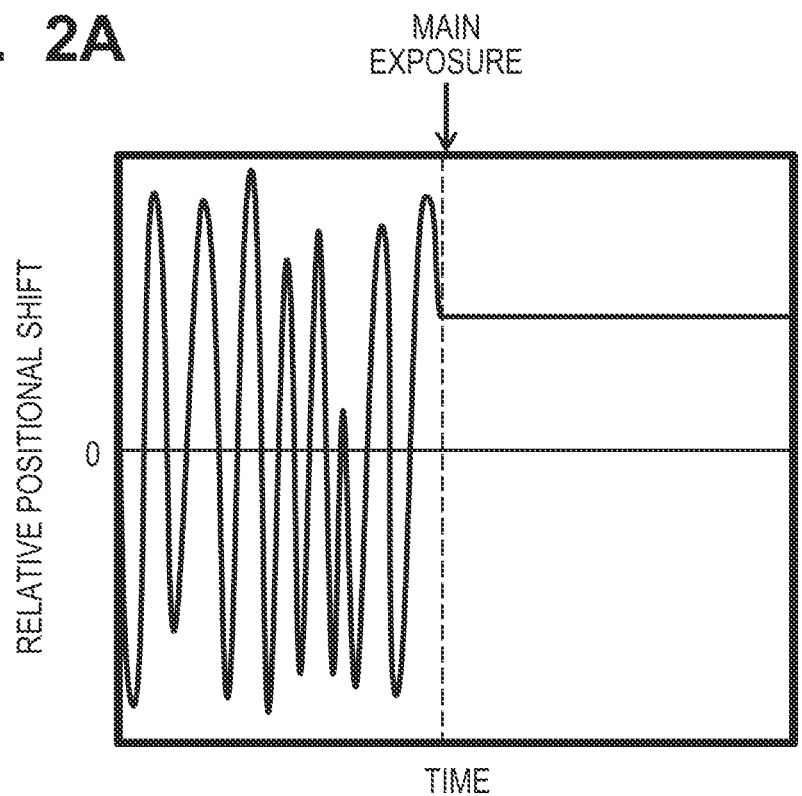
FIG. 2A is a graph showing a relative positional shift between a mold and a shot region of a substrate in an alignment operation according to a comparative example.

FIG. 2A shows a relative positional shift (relative vibration) between a mold M and a shot region of a substrate S in an alignment operation according to a comparative example. Note that the alignment operation is performed by a relative driving mechanism DM in a state in which the mold M (a pattern portion P thereof) and an imprint material IM on the shot region of the substrate S are in contact with each other. In FIG. 2A, "main exposure" indicates a timing at which a curing unit 8 irradiates the whole of the imprint material IM with light (exposes the imprint material IM) and cures the imprint material IM. A period from the left end of the FIG. 2A to "main exposure" is a period in which the mold M and the shot region of the substrate S are aligned by the relative driving mechanism DM.

When the curing unit 8 irradiates the whole of the imprint material IM with light and cures the imprint material IM, the substrate S and the mold M are coupled by the cured imprint material IM. In this state, a relative vibration between the mold M and the shot region of the substrate S disappears, and a relative positional shift is fixed. This relative positional shift becomes an overlay error between a pattern formed by an imprint process and an underlying pattern thereof.

Figure 2B:
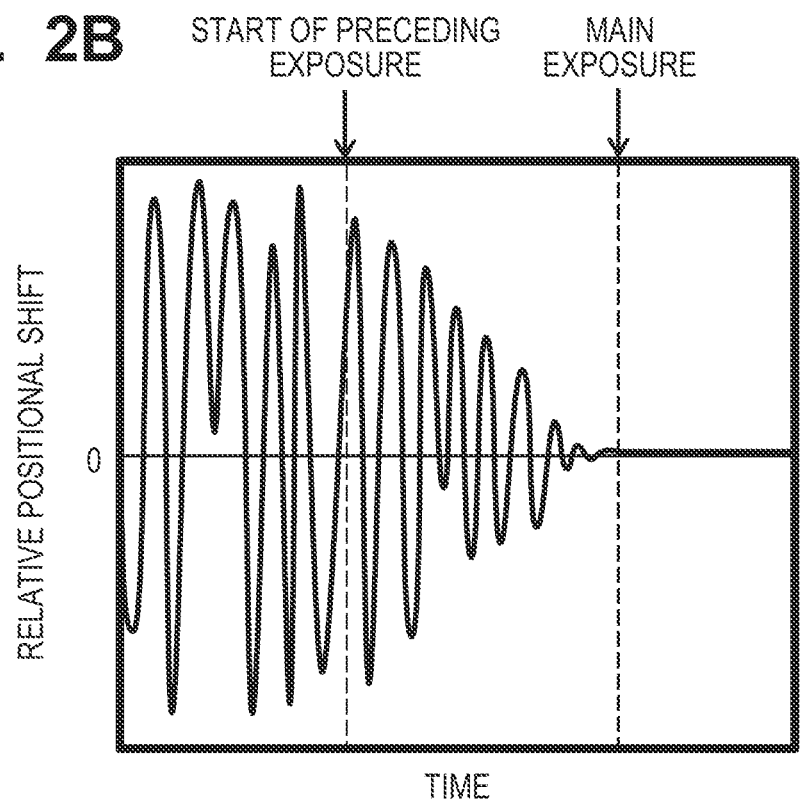
FIG. 2B is a graph showing a relative positional shift between a mold and a shot region of a substrate in an alignment operation according to the embodiment.

FIG. 2B shows a relative positional shift (relative vibration) between the mold M and the shot region of the substrate S in the alignment operation according to this embodiment. In FIG. 2B, "main exposure" indicates a timing at which the curing unit 8 irradiates the whole of the imprint material IM with light (exposes the imprint material IM) and cures the imprint material IM. A period from the left end of the FIG. 2B to "main exposure" is a period in which the mold M and the shot region of the substrate S are aligned by the relative driving mechanism DM. In addition, the "start of preceding exposure" indicates a timing at which preceding exposure is started. In this embodiment, the curing unit 8 irradiates, with light, a preceding exposure portion serving as a part out of the whole of the imprint material IM on the shot region of the substrate S in a state in which the mold M and the imprint material IM on the shot region of the substrate S are in contact with each other. Therefore, only the preceding exposure portion out of the whole of the imprint material IM on the shot region of the substrate S is exposed selectively. This will be referred to as preceding exposure.

When preceding exposure is started, viscoelasticity of the preceding exposure portion of the imprint material IM is increased. An increase in viscoelasticity of the preceding exposure portion of the imprint material IM means an increase in rigidity between the substrate S and the mold M. Therefore, after the start of preceding exposure, an amplitude of the relative positional shift between the mold M and the shot region of the substrate S decreases gradually. This makes it possible to improve an alignment accuracy. It is also possible to suppress a decrease in filling property in a portion other than the preceding exposure portion out of the imprint material on the shot region by exposing only the preceding exposure portion. This makes it possible to improve throughput. The preceding exposure portion can be determined arbitrarily in consideration of the filling property.

Light irradiation ("main exposure") for curing the imprint material IM on the shot region of the substrate S in the whole area of the shot region is performed at a timing when the relative positional shift between the mold M and the shot region of the substrate S falls within an allowable range.

Figure 3A:
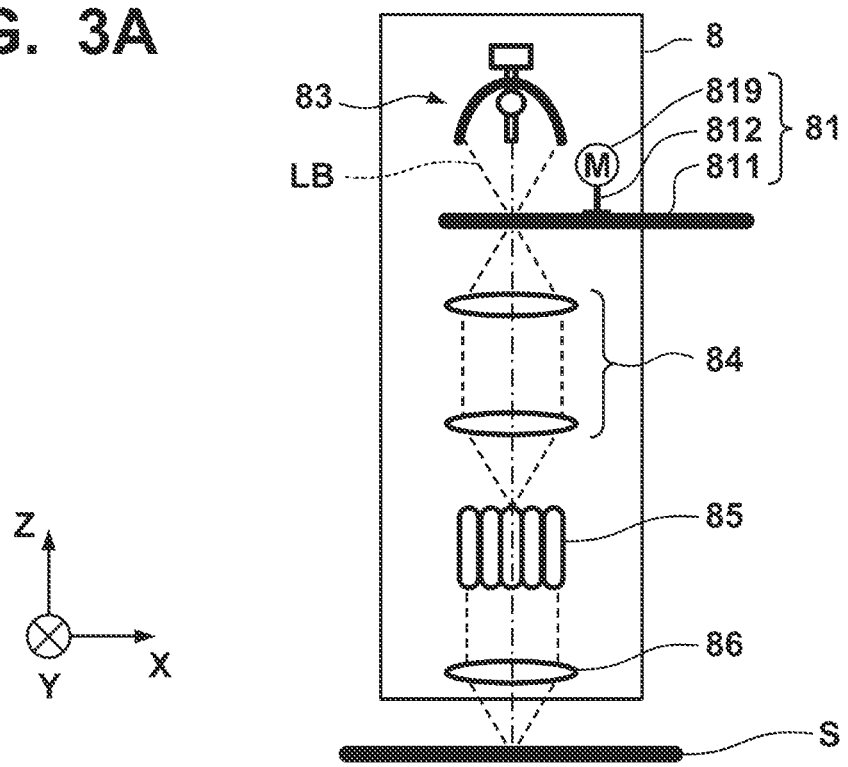
FIGS. 3A and 3B are views each showing an example of the arrangement of a curing unit.
Figure 3B:
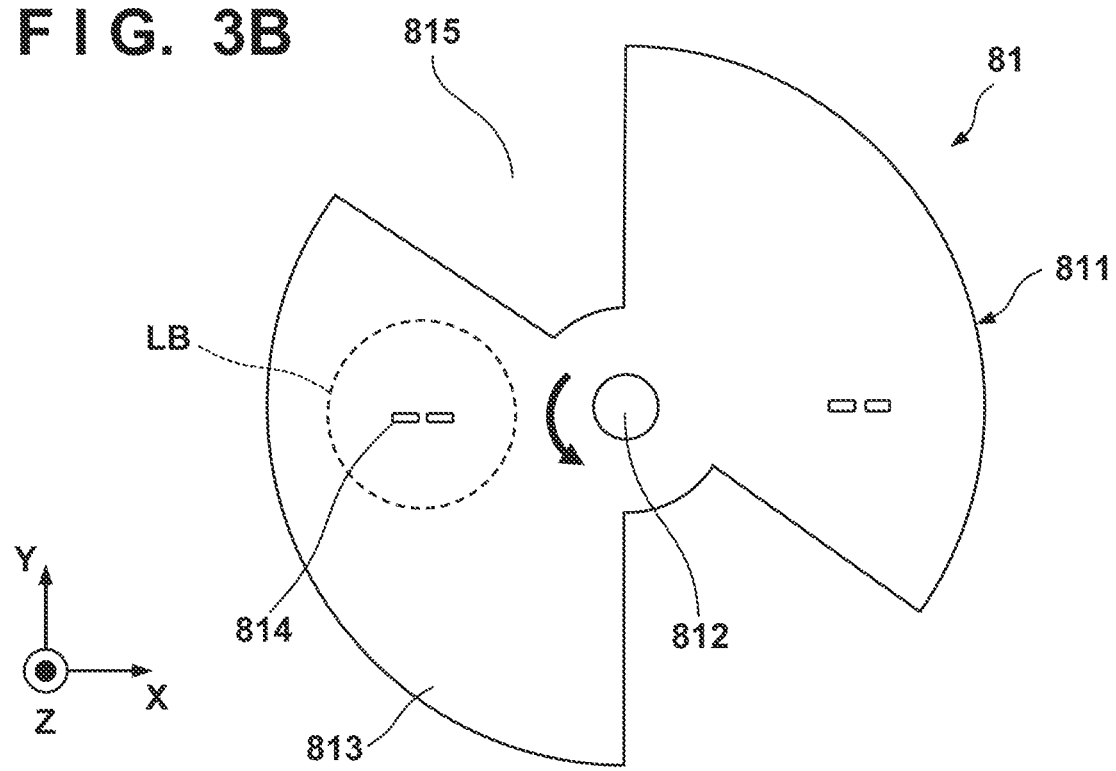

Each of FIGS. 3A and 3B shows an example of the arrangement of the curing unit 8. The curing unit 8 can include a light source 83, a shutter mechanism 81, an imaging optical system 84, a fly-eye lens 85, and an imaging optical system 86. The light source 83 can be, for example, a lamp such as a mercury lamp, or a solid-state light source such as a laser or an LED. The shutter mechanism 81 can include a shutter plate 811 and an actuator 819 that drives the shutter plate 811. The actuator 819 can be configured to, for example, pivot the shutter plate 811, but may be configured to drive the shutter plate 811 in one axial direction (reciprocating driving).

An intermediate image of the light source 83 can be formed on a surface where the shutter plate 811 is arranged. The imaging optical system 84 can be configured to set the surface where the shutter plate 811 is arranged and an incident surface of the fly-eye lens 85 in an optically conjugate positional relationship. The imaging optical system 86 can be configured to set the substrate S and the incident surface of the fly-eye lens 85 in an optically conjugate positional relationship.

The shutter plate 811 is in connection with the actuator 819 via a drive shaft 812 and can be pivoted by the actuator 819. A dotted line in FIG. 3B indicates a region (optical path) where light LB from the light source 83 enters. The shutter plate 811 includes a blocking portion 813 that blocks the light LB from the light source 83. The shutter plate 811 also includes first passing portions 814 for irradiating, with light, the preceding exposure portion serving as the part out of the whole of the imprint material IM on the shot region and a second passing portion 815 for irradiating the whole of the imprint material IM on the shot region with light. In this example, the shutter plate 811 has a two-fold rotational symmetry structure, but may have another structure.

Figure 4A:
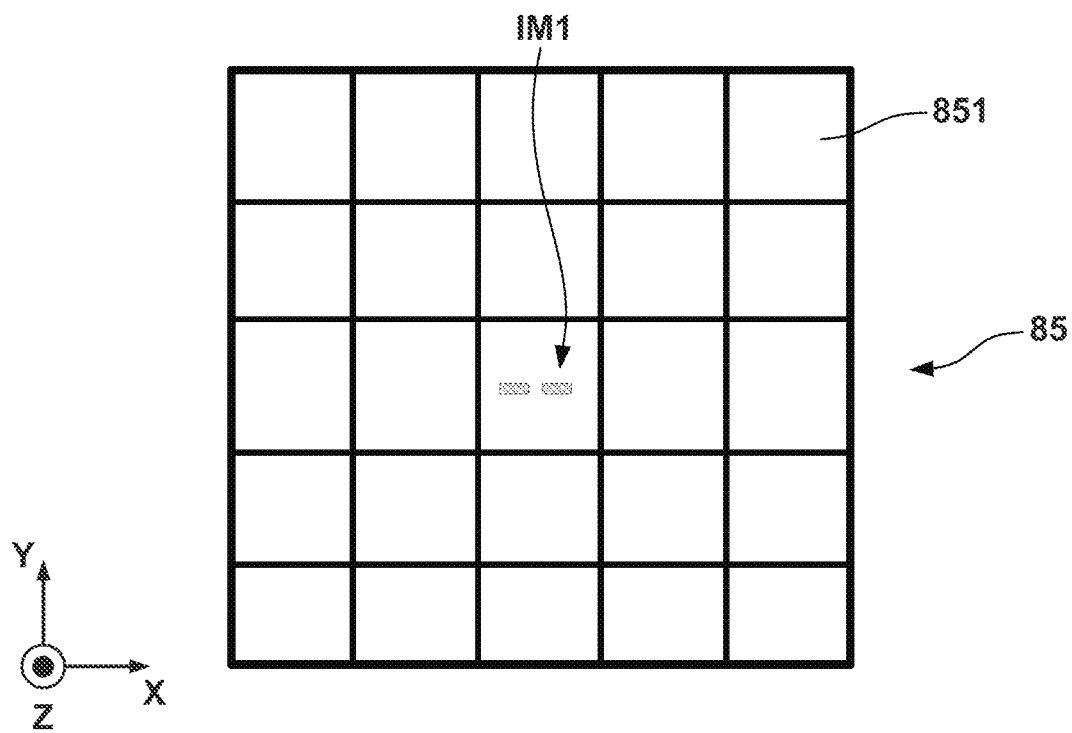
FIG. 4A is a view showing a fly-eye lens.

FIG. 4A is a view showing the fly-eye lens 85 from the side of the light source 83. The fly-eye lens 85 is an aggregate of a plurality of lenses 851. A back focal plane of each lens 851 matches an incident surface. Each lens 851 can be, for example, a spherical lens, an aspherical lens, a cylindrical lens, or the like. In an example of FIG. 4A, the fly-eye lens 85 is formed by 5×5 lenses 851. Light entering the fly-eye lens 85 is divided by the plurality of lenses 851 and forms a plurality of (5×5 in FIG. 4A) secondary light sources on its exit surface. A plurality of these secondary light sources Koehler-illuminate the substrate S. The plurality of lenses 851 that form the fly-eye lens 85 divide a light intensity distribution on the incident surface of the fly-eye lens 85, and superimpose and illuminate the substrate S. In other words, a plurality of light beams which are, respectively, output from the plurality of lenses 851 enter each point on the substrate S overlappingly.

In the example of FIG. 4A, light that has passed through the first passing portions 814 of the shutter plate 811 enters only one lens 851 at the center out of the plurality of lenses 851 and forms an intermediate image IM1 of the first passing portions 814. As described above, the substrate S and the incident surface of the fly-eye lens 85 are optically conjugated, making it possible to define a position at which light enters the substrate S by defining an incident region of light with respect to the incident surface (here, the lens 851 at the center) of the fly-eye lens 85. It is possible to define an incident position and intensity of light with respect to the substrate S by defining the number of lenses 851 and a position where the light that has passed through the first passing portions 814 of the shutter plate 811 enters.

In this example, the fly-eye lens 85 is arranged between the shutter plate 811 and the substrate S. However, an arrangement may be adopted, which forms a light intensity distribution (passing portion) on a surface where the shutter plate 811 is arranged into an image on the substrate S directly.

Figure 4B:
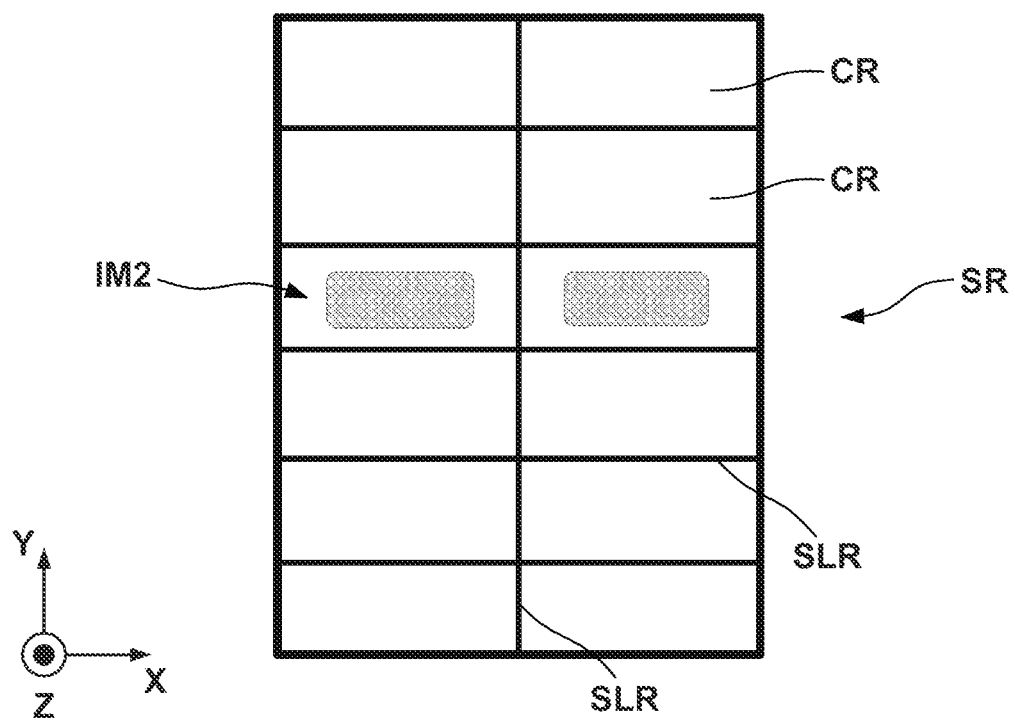
FIG. 4B is a view showing the arrangement of a shot region.

FIG. 4B shows a shot region SR of the substrate S. The shot region SR can include a plurality of chip regions CR and scribe line regions SLR that separate the plurality of chip regions CR from each other. One chip region CR corresponds to one chip (die) to be manufactured. In preceding exposure, an image IM2 of the intermediate image IM1 is formed in a preceding exposure region serving as a part of the entire shot region SR, and only the preceding exposure region is exposed. The preceding exposure region is a region where the light that has passed through the first passing portions 814 of the shutter plate 811 enters and corresponds to the preceding exposure portion serving as a part out of the whole of the imprint material IM on the shot region SR. In other words, in preceding exposure, the imprint material IM on the preceding exposure region (that is, the preceding exposure portion) is exposed, and the imprint material IM on a region other than the preceding exposure region is not exposed. In still other words, an operation of exposing the preceding exposure region out of the shot region SR is equivalent to an operation of exposing the preceding exposure portion out of the imprint material IM on the shot region SR.

The line width of a circuit pattern can be, for example, 100 nm or less and can be on a 10 nm level when it is small. The line width of a pattern arranged in the scribe line regions SLR is on a micrometer level, on a several hundred nm level even when it is small, and larger than that of the pattern circuit. A pattern density of the scribe line regions SLR is smaller than that of a circuit pattern region.

Bringing the imprint material IM on the shot region of the substrate S and the pattern portion P of the mold M into contact with each other, a concave portion that forms a pattern of the pattern portion P is filled with the imprint material IM by a capillary phenomenon. The filling speed of the imprint material IM is high in the circuit pattern region (chip region CR) with a small pattern line width and a high pattern density, and the filling speed of the imprint material IM is low in the scribe line regions SLR. Therefore, when preceding exposure is performed on the imprint material IM on the scribe line regions SLR, the viscoelasticity of the imprint material IM on the scribe line regions SLR increases, further decreasing the filling speed. To cope with this, the preceding exposure portion (preceding exposure region) can be decided so that light enters at least a portion of at least one chip region CR of the plurality of chip regions CR. More specifically, the preceding exposure portion (preceding exposure region) can be decided so the light enters at least the portion of at least one chip region CR of the plurality of chip regions CR, and the significant amount of light does not enter the scribe line regions SLR. Note that the significant amount of light is the amount of light that increases the viscoelasticity of the imprint material IM to a non-negligible extent. The driving speed of the shutter plate 811 is decided so light entering the scribe line regions SLR inevitably in order to drive the shutter plate 811 does not become the significant amount of light. The preceding exposure portion (preceding exposure region) is defined by the arrangement of the first passing portions 814 in the shutter plate 811 and driving of the shutter plate 811 by the actuator 819.

It is not preferable that the viscoelasticity of the preceding exposure portion of the imprint material on the shot region SR increases more than expected in preceding exposure, or leakage light enters the imprint material on the scribe line regions SLR, decreasing the filling speed. To cope with this, for example, the shutter plate 811 may be vibrated by vibrating the drive shaft 812 to distribute portions irradiated with light.

Figure 5:
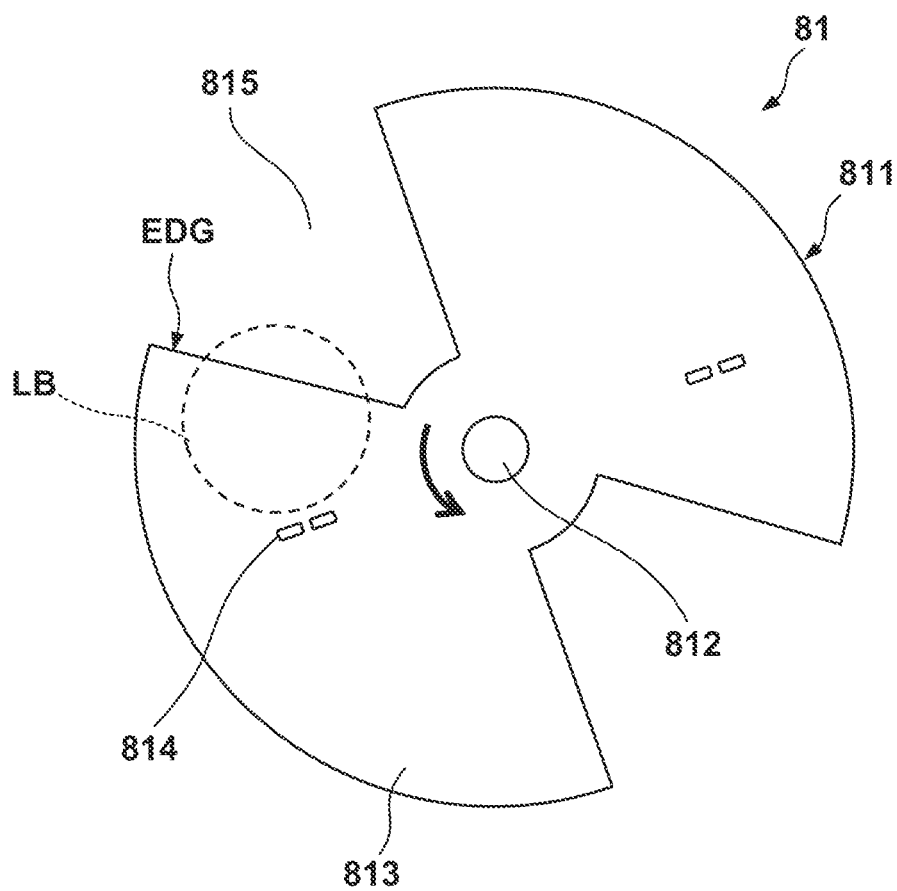
FIG. 5 is a view showing an operation of a shutter plate.

FIG. 5 shows a state halfway through main exposure using the second passing portion 815 which is performed after preceding exposure using the first passing portions 814 ends. If the imprint material is cured within an extremely short time, the shrinkage and heating of the imprint material may occur instantaneously, decreasing an overlay accuracy. To cope with this, a pivoting speed of the shutter plate 811 while an edge EDG of the blocking portion 813 defining the second passing portion 815 moves across an optical path of the light LB can be adjusted in accordance with the properties of the imprint material.

Figure 6:
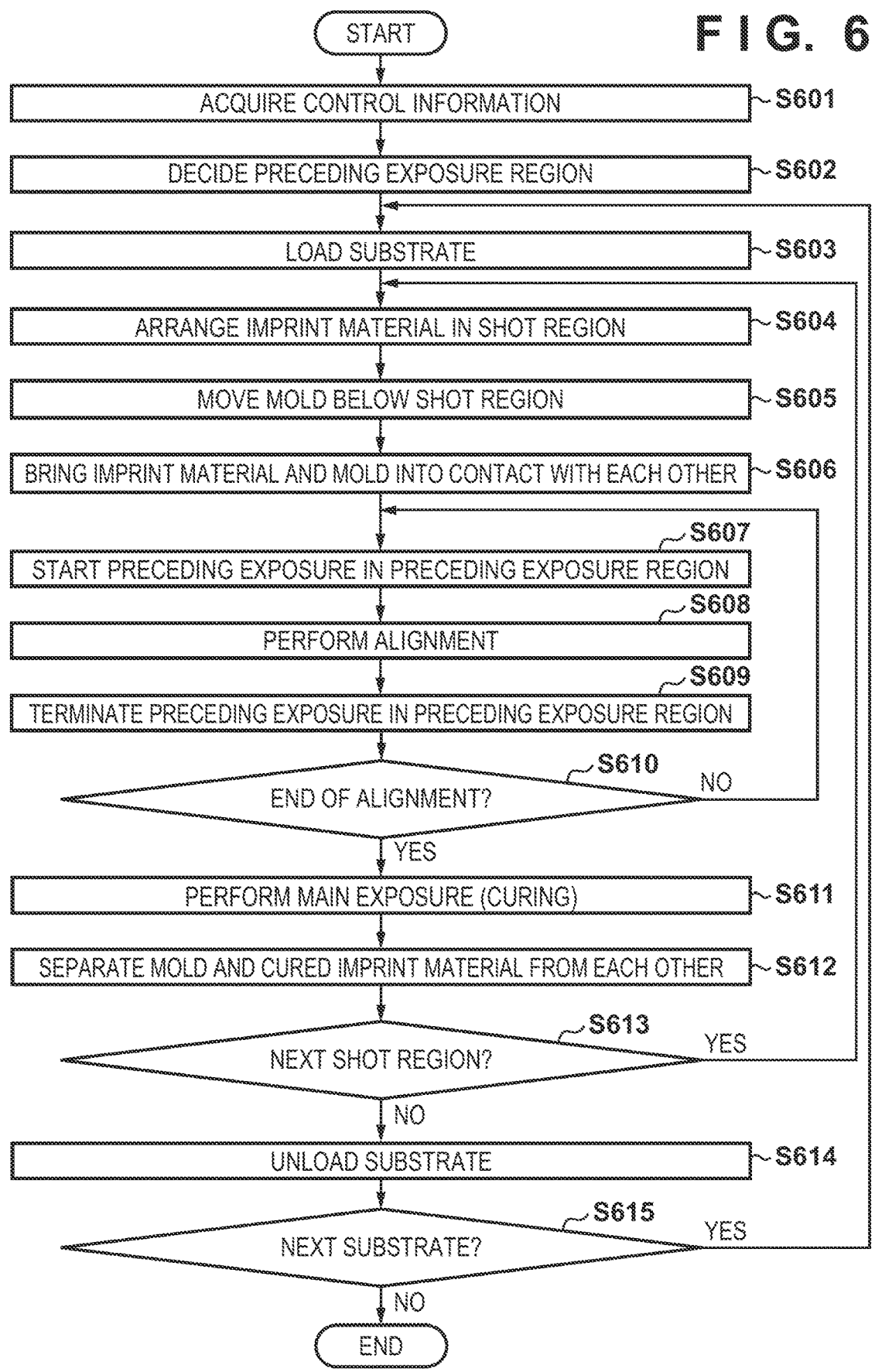
FIG. 6 is a flowchart showing an operation of the imprint apparatus.

FIG. 6 shows an operation of the imprint apparatus 100. This operation can be controlled by the controller 11. In step S601, the controller 11 acquires control information (process recipe) from a host control apparatus or the like. The control information can include, for example, shot layout information indicating the arrangement of a plurality of shot regions of the substrate S and chip layout information indicating the arrangement of a plurality of chip regions in each shot region. The control information may or may not include position information indicating the position of the preceding exposure region (preceding exposure portion).

In step S602, the controller 11 decides the preceding exposure region. Note that if the control information includes the position information indicating the position of the preceding exposure region, the controller 11 can decide the preceding exposure region based on the position information. On the other hand, if the control information does not include the position information, the controller 11 can decide the preceding exposure region based on the chip layout information. Further, in accordance with the decided preceding exposure region, the controller 11 generates a driving profile (control information for operating the actuator 819) of the shutter mechanism 81. Furthermore, for a shot region (edge shot region) in which the shape of the shot region is defined by the edge of the substrate S, the controller 11 can be configured to adjust the preceding exposure region in accordance with the shape.

In step S603, the controller 11 controls conveyance of the substrate S such that the substrate S is loaded onto the substrate stage 2. In step S604, the controller 11 controls the dispenser 9 and the substrate positioning mechanism SA such that the imprint material IM is arranged in a shot region of a pattern formation target out of the plurality of shot regions of the substrate S. In step S605, the controller 11 controls the substrate positioning mechanism SA such that the shot region of the pattern formation target moves below the mold M. In step S606, the controller 11 controls the relative driving mechanism DM such that the imprint material IM and the pattern portion P of the mold M are brought into contact with each other in the whole area of the shot region of the pattern formation target.

In step S607, the controller 11 controls the curing unit 8 (shutter mechanism 81) such that preceding exposure for the preceding exposure region (preceding exposure portion) is started. As shown in FIG. 2B, when preceding exposure is started, the viscoelasticity of the preceding exposure portion can increase gradually, and a relative vibration between the substrate S and the mold M can decrease. In step S608, the controller 11 controls the relative driving mechanism DM such that the mold M and the shot region of the pattern formation target are aligned based on a relative position of the mold M and the shot region of the pattern formation target while detecting the relative positions by using the alignment scope 10. In step S609, the controller 11 controls the curing unit 8 (shutter mechanism 81) such that preceding exposure for the preceding exposure region (preceding exposure portion) ends.

In step S610, the controller 11 determines whether a relative position error between the mold M and the shot region of the pattern formation target detected by using the alignment scope 10 falls within an allowable range. Then, if the relative position error falls within the allowable range, the process advances to step S611; otherwise, the process returns to step S607.

In step S611, the controller 11 controls the curing unit 8 (shutter mechanism 81) such that the whole of the imprint material IM on the shot region of the pattern formation target is exposed. Consequently, the whole of the imprint material IM on the shot region of the pattern formation target is cured, and a pattern made of a cured product of the imprint material IM is formed. In step S612, the controller 11 controls the relative driving mechanism DM such that the mold M and the pattern made of the cured product of the imprint material IM on the shot region of the pattern formation target are separated from each other.

In step S613, the controller 11 determines whether there is a shot region where a next pattern is to be formed. If there is the shot region where the next pattern is to be formed, the process returns to step S604; otherwise, the process advances to step S614. In step S614, the controller 11 controls conveyance of the substrate S on the substrate stage 2 such that the substrate S is unloaded. In step S615, the controller 11 determines whether there is the substrate S to be processed next. If there is the substrate to be processed next, the process returns to step S603; otherwise, the operation is terminated.

Figure 7A:
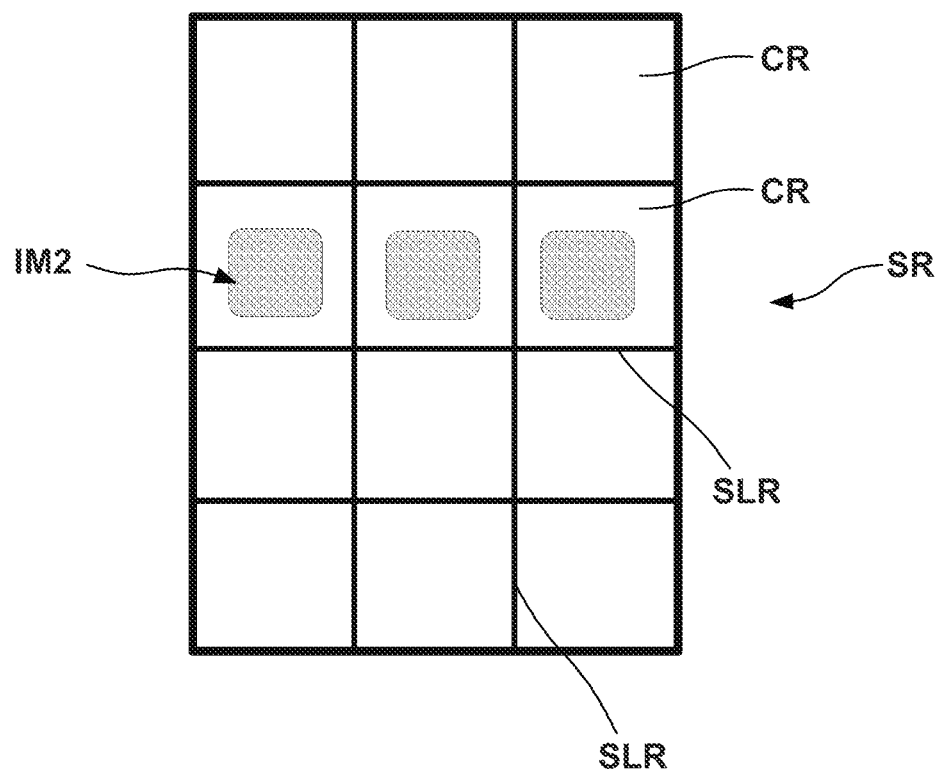
FIG. 7A is a view showing the arrangement of the shot region.
Figure 7B:
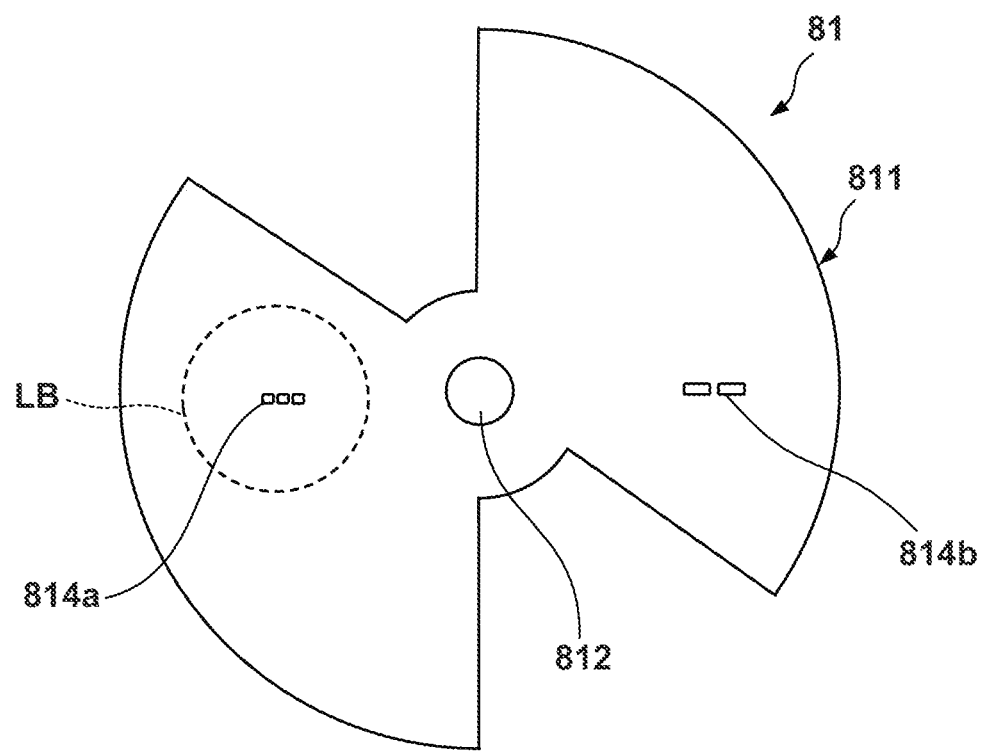
FIG. 7B is a view showing an example of the arrangement of the shutter plate.

The shutter plate 811 can include a plurality of types of first passing portions 814 to be able to support the arrangement of various preceding exposure portions. FIG. 7A shows an example in which one shot region SR includes 4×3 chip regions CR. FIG. 7B shows the shutter plate 811 which includes first passing portions 814a for supporting the shot region SR shown in FIG. 7A. The shutter plate 811 can include other first passing portions 814b in addition to the first passing portions 814a. Based on the arrangement of the plurality of chip regions CR that form the shot region SR, the controller 11 can be configured to select the first passing portions used for preceding exposure out of the first passing portions 814a and 814b.

Figure 8A:
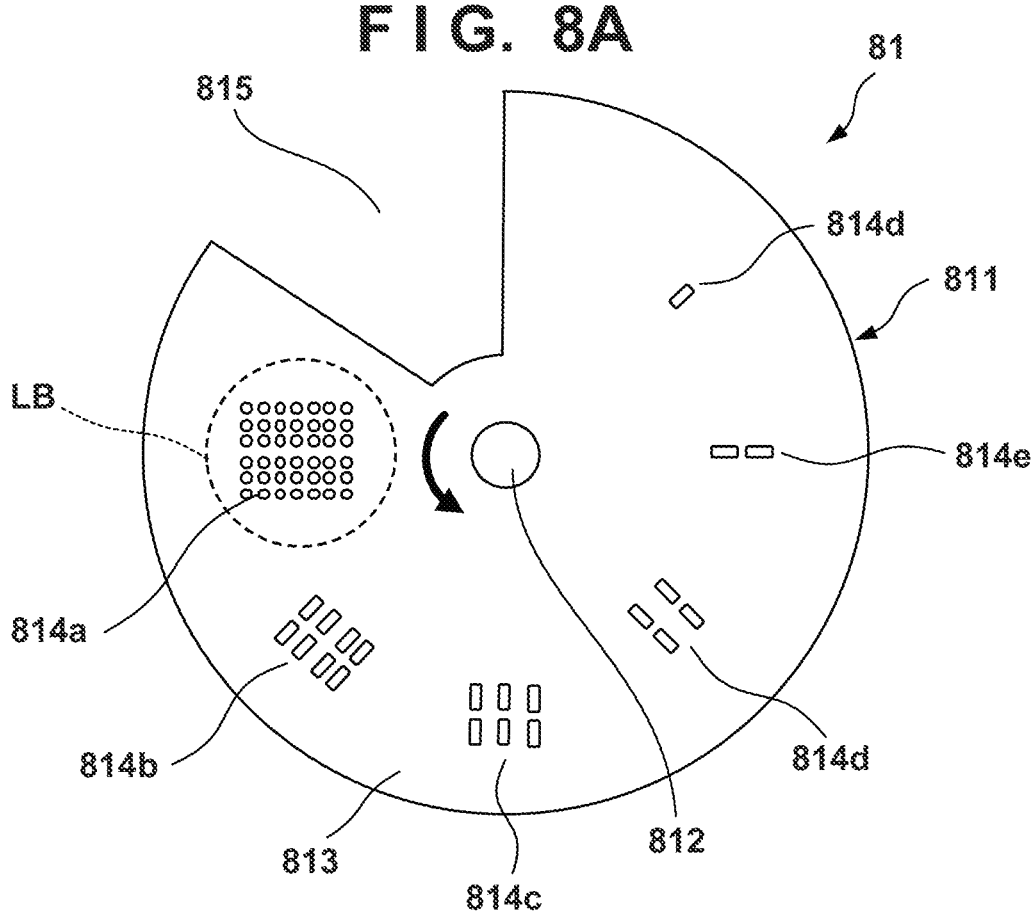
FIGS. 8A to 8C are views each showing an example of the arrangement of the shutter plate.
Figure 8B:
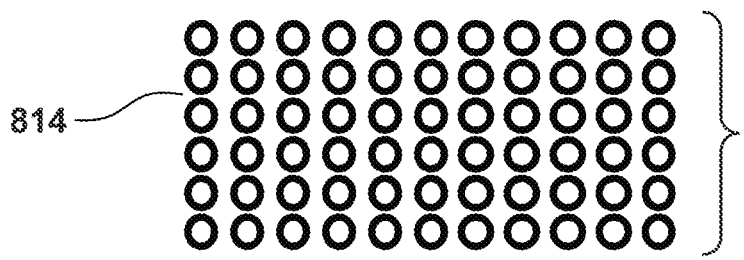
Figure 8C:
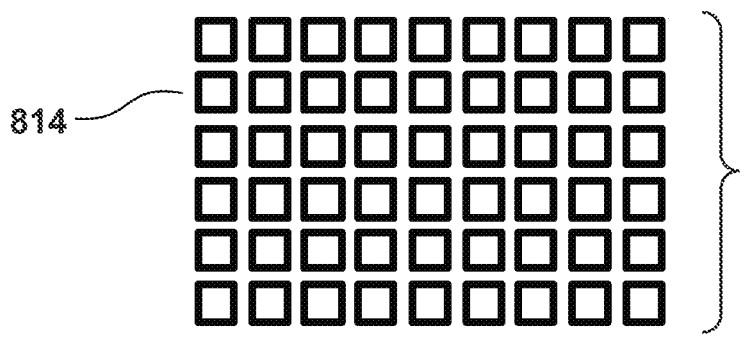

FIG. 8A shows the shutter plate 811 that includes the plurality of types of first passing portions 814a to 814d. Based on the arrangement of the plurality of chip regions CR that form the shot region SR, the controller 11 can be configured to select the first passing portions used for preceding exposure out of the plurality of first passing portions 814a to 814d. FIG. 8B shows an example of the first passing portions 814. FIG. 8C shows another example of the first passing portions 814. The first passing portions 814 can be formed as through holes. The through holes can be, for example, round holes formed by drilling, or square holes formed by punching or etching. Alternatively, the first passing portions 814 may be a mesh sheet or a mesh plate. Additionally, a glass plate where a light-shielding film is deposited in a region other than regions of the first passing portions 814 may be fixed to the shutter plate.

If the first passing portions 814 are formed by simple openings, and an aberration from the surface where the shutter plate 811 is arranged to a surface where the substrate S is arranged is sufficiently small (the width of a spot diagram is smaller than the width of each opening), it may be impossible to irradiate the preceding exposure portion with sufficiently weak light. That is, the illuminance at positions on the substrate S corresponding to the first passing portions 814 is reduced only to a degree of a value obtained by dividing the illuminance in main exposure by the number of lenses that form the fly-eye lens 85. Consequently, the preceding exposure portion may be cured before the relative positional shift between the shot region and the mold M falls within the allowable range.

It is therefore desirable that the illuminance on a substrate surface is decreased by making the width of the spot diagram of an optical system from the surface where the shutter plate 811 is arranged to the substrate surface larger than the width of each opening. However, an imprint material on the scribe line regions is also exposed if the width of the spot diagram is larger than the size of each chip region. It is therefore desirable that the width of the spot diagram is smaller than the dimension of each chip region.

It is also possible to decrease the illuminance on the substrate surface by forming the first passing portions 814 into a mesh shape. If the width of the spot diagram on the substrate surface is larger than a dimension corresponding to the width of one opening that forms a mesh, the illuminance on the substrate surface becomes lower than the value obtained by dividing the illuminance at the time of main exposure by the number of lenses that form the fly-eye lens 85. It is also desirable that the width of the spot diagram on the substrate surface is larger than a dimension corresponding to a pitch of the mesh. In this case, light beams from the respective openings that form the mesh are connected without any gap on the substrate surface. Furthermore, if a half width of the spot diagram on the substrate surface is larger than the dimension corresponding to the pitch of the mesh, the mesh is smoothed on the substrate surface, making it possible to reduce illuminance nonuniformity in the preceding exposure portion. If these conditions are met, it is possible to adjust the illuminance of the preceding exposure portion by adjusting the dimension of each opening in the mesh.

Figure 9A:
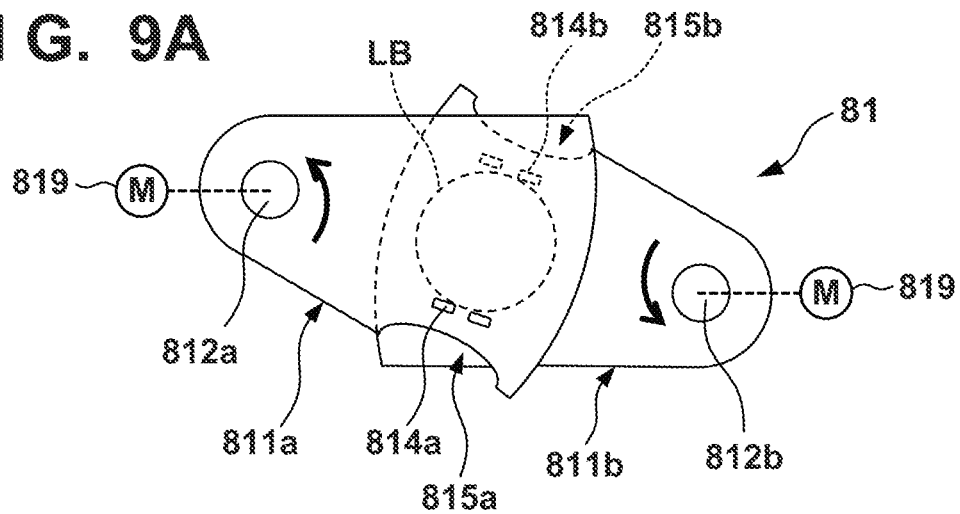
FIGS. 9A to 9C are views each showing an example of the arrangement and an example of an operation of the shutter plate.
Figure 9B:
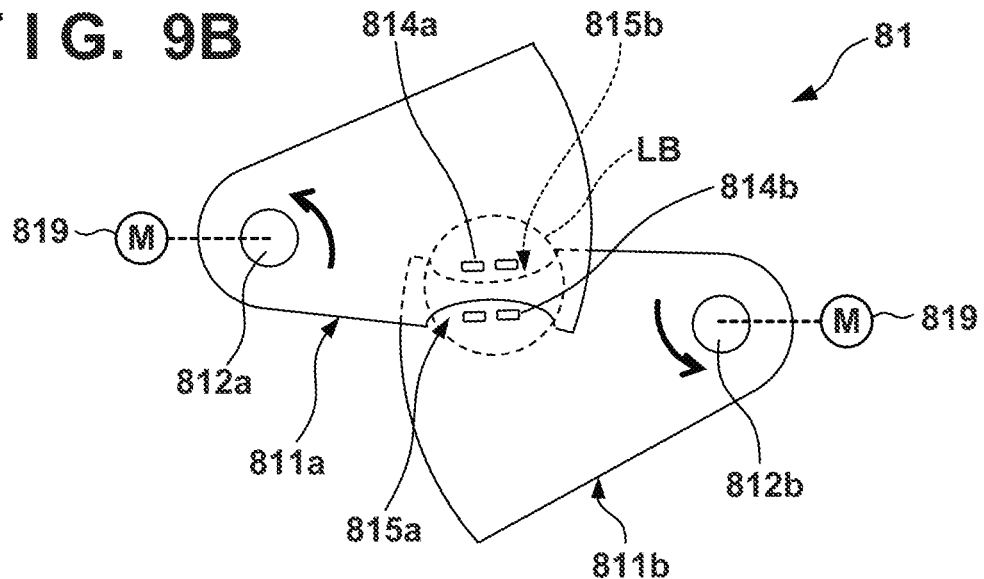
Figure 9C:
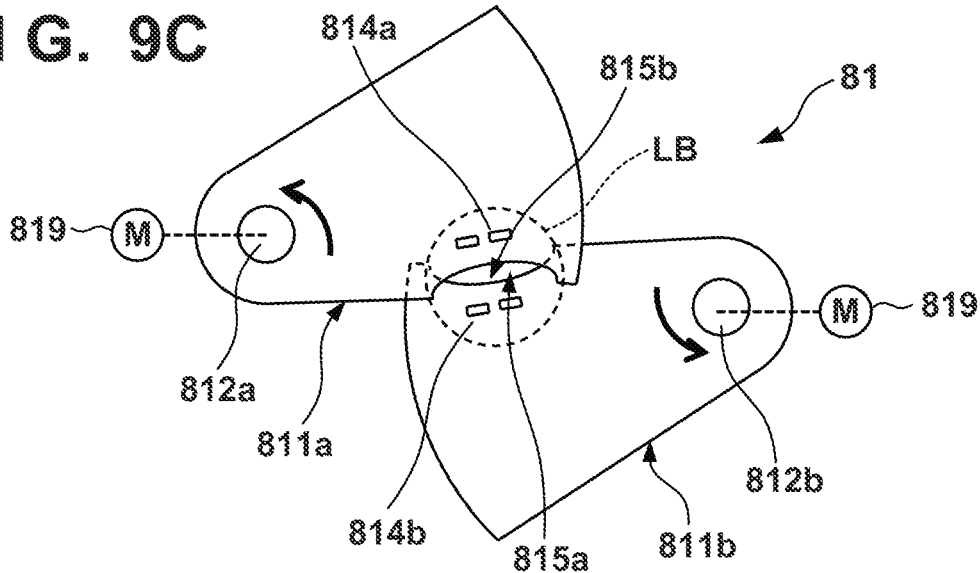

Each of FIGS. 9A to 9C shows an example of another arrangement of the shutter mechanism 81. The shutter mechanism 81 in the example of the other arrangement includes two shutter plates 811a and 811b, and controls light irradiation (preceding exposure and main exposure) to the shot region of the substrate S by the two shutter plates 811a and 811b. The shutter plates 811a and 811b are connected to the actuator 819 via drive shafts 812a and 812b, respectively, and driven by the actuator 819. Note that the actuator 819 may include individual actuators for driving the shutter plates 811a and 811b individually. The shutter plates 811a and 811b include the first passing portions 814a and 814b, respectively. The shutter plates 811a and 811b also include second passing portions 815a and 815h, respectively.

FIG. 9A shows a state in which the shutter plates 811a and 811b completely block light from the light source 83 to the imprint material IM (substrate S). FIG. 9B shows a state in which preceding exposure is performed on the preceding exposure portion of the imprint material IM on the shot region by light passing through the first passing portions 814a and 814b. FIG. 9C shows a state immediately after the start of main exposure of exposing the whole of the imprint material on the shot region by light passing through the second passing portions 815a and 815b. The actuator 819 drives the two shutter plates 811a and 811b in directions opposite to each other when starting light irradiation to the whole of the imprint material IM in main exposure. This makes it possible to makes a change in light intensity distribution formed in the imprint material IM on the shot region at the time of main exposure symmetric, and to make a shrinkage strain caused by curing the imprint material IM symmetric.

According to the above-described examples of the arrangement, it is possible to decrease a rotation amount per shutter plate. It is therefore possible to speed up the control of light irradiation to the imprint material IM, improving throughput advantageously.

The number of shutter plates may be three or more. In addition, the shutter mechanism may be, for example, an iris shutter mechanism.

A pattern of a cured product formed using the imprint apparatus is used permanently for at least some of various articles or used temporarily to manufacture various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of the cured product is used intact as a constituent member of some of the above-described articles or used temporarily as a resist mask. The resist mask is removed after etching, ion implantation, or the like is performed in a processing step of the substrate.

Figure 10A:
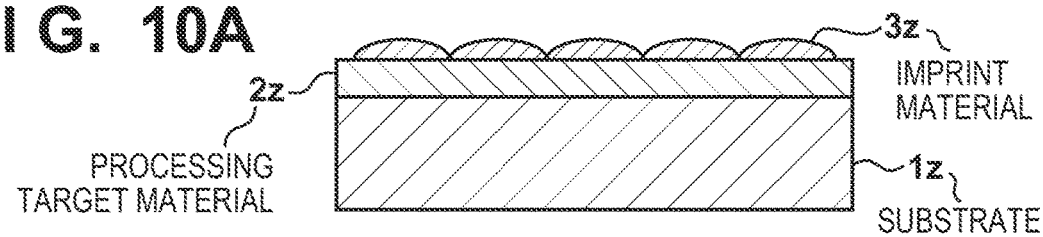
FIGS. 10A to 10F show views of a method of manufacturing an article.

An article manufacturing method of forming a pattern on a substrate by an imprint apparatus, processing the substrate on which the pattern has been formed, and manufacturing an article from the substrate on which the process has been performed will be described next. As shown in FIG. 10A, a substrate $1z$ such as a silicon wafer having a processing target material $2z$ such as an insulator formed on its surface is prepared, and then an imprint material $3z$ is applied onto the surface of the processing target material $2z$ by an inkjet method or the like. A state in which the imprint material $3z$ formed into a plurality of droplets is applied onto the substrate is shown here.

Figure 10B:
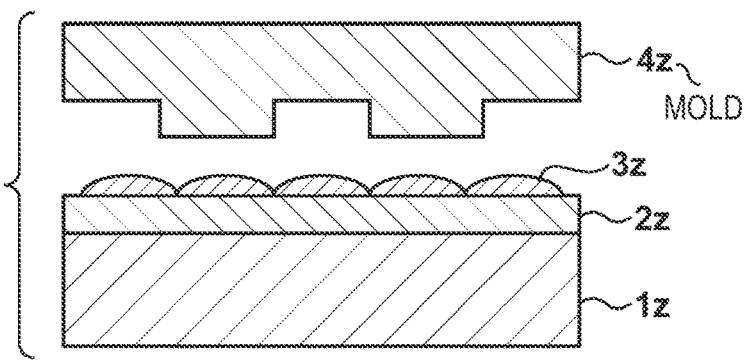
Figure 10C:
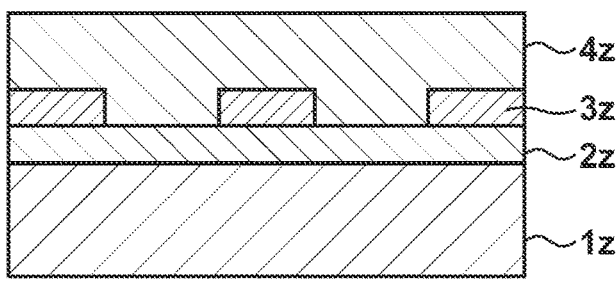

As shown in FIG. 10B, a side of an imprinting mold $4z$ on which its three-dimensional pattern is formed faces the imprint material $3z$ on the substrate. As shown in FIG. 10C, the mold $4z$ and the substrate $1z$ to which the imprint material $3z$ is applied are brought into contact with each other, and a pressure is applied. A gap between the mold $4z$ and the processing target material $2z$ is filled with the imprint material $3z$. When the imprint material $3z$ is irradiated with light as curing energy through the mold $4z$ in this state, the imprint material $3z$ is cured.

Figure 10D:
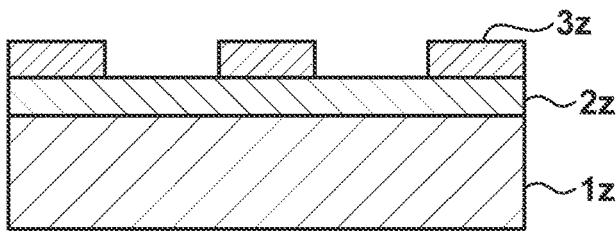

As shown in FIG. 10D, the pattern of the cured product of the imprint material $3z$ is formed on the substrate $1z$ by separating the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 10E:
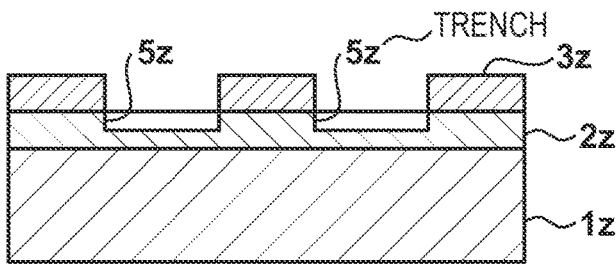
Figure 10F:
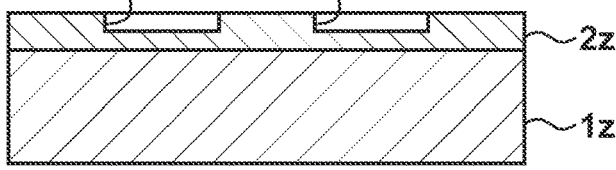

As shown in FIG. 10E, out of the surface of the processing target material $2z$, portions without any cured product or portions where the cured products remain thin are removed to form trenches $5z$ by performing etching using the pattern of the cured product as an etching resistant mask. As shown in FIG. 10F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-179008, filed Sep. 19, 2017, which is hereby incorporated by reference herein in its entirety.

What is claimed is:

1. An imprint apparatus that cures an imprint material on a shot region of a substrate by light irradiation and forms a pattern on the shot region in a state in which a mold is in contact with the imprint material, the apparatus comprising:
   a light source configured to emit light;
   a shutter mechanism including a shutter plate configured to control light irradiation to the imprint material on the shot region and an actuator configured to drive the shutter plate, the shutter plate including a first passing portion and a second passing portion;
   a driving mechanism configured to change relative positions of the substrate and the mold; and
   a controller configured to control the light source, the shutter mechanism, and the driving mechanism to:
   (i) cause the actuator to drive the shutter plate such that a part out of a whole of the imprint material on the shot region is irradiated with light that has passed through the first passing portion, (ii) then cause the driving mechanism to perform alignment between the shot region and the mold while the part out of the whole of the imprint material on the shot region is irradiated with light that has passed through the first passing portion, and (iii) then after the alignment between the shot region and the mold, performed while the part out of the whole of the imprint material on the shot region is irradiated with light that has passed through the first passing portion, is completed, cause the actuator to drive the shutter plate such that the whole of the imprint material is irradiated with light that has passed through the second passing portion.

2. The apparatus according to claim 1, wherein the controller causes the actuator to pivot the shutter plate.

3. The apparatus according to claim 1, wherein the controller causes the actuator to drive the shutter plate such that the part out of the whole of the imprint material is irradiated with light that has passed through the first passing portion after the imprint material and the mold contact each other in a whole area of the shot region.

4. The apparatus according to claim 1, wherein the shutter plate includes a plurality of first passing portions including the first passing portion.

5. The apparatus according to claim 4, wherein the shot region includes a plurality of chip regions, and
   based on an arrangement of the plurality of chip regions in the shot region, the first passing portion to be used out of the plurality of first passing portions is selected.

6. The apparatus according to claim 1, wherein the shutter mechanism includes two shutter plates including the shutter plate, and light irradiation to the shot region is controlled by the controller controlling the two shutter plates.

7. The apparatus according to claim 6, wherein the controller causes the actuator to drive the two shutter plates in directions opposite to each other when starting light irradiation to the whole of the imprint material.

8. The apparatus according to claim 1, wherein the shutter plate is arranged on a surface conjugate to a surface where the substrate is arranged.

9. The apparatus according to claim 1, further comprising a fly-eye lens having an incident surface which is arranged on a surface conjugate to a surface where the shutter plate is arranged,
wherein the imprint material is irradiated with light that has passed through the fly-eye lens.

10. An imprint method of curing an imprint material on a shot region of a substrate by light irradiation using (i) a light source configured to emit light, (ii) a shutter mechanism including a shutter plate configured to control the light irradiation to the imprint material on the shot region and an actuator configured to drive the shutter plate, the shutter plate including a first passing portion and a second passing portion, (iii) a driving mechanism configured to change relative positions of the substrate and a mold, and (iv) a controller configured to control the light source, the shutter mechanism, and the driving mechanism, and forming a pattern on the shot region in a state in which the mold is in contact with the imprint material, the method comprising:
causing, by the controller, the actuator to drive the shutter plate such that a part out of a whole of the imprint material on the shot region is irradiated with light that has passed through the first passing portion;
causing, by the controller, the driving mechanism to perform alignment between the shot region and the mold while the part out of the whole of the imprint material on the shot region is irradiated with light that has passed through the first passing portion; and
causing, by the controller, the actuator to drive, after the alignment between the shot region and the mold, performed while the part out of the whole of the imprint material on the shot region is irradiated with light that has passed through the first passing portion, is completed, the shutter plate such that the whole of the imprint material is irradiated with light that has passed through the second passing portion.

11. The method according to claim 10, wherein driving the shutter plate includes pivoting the shutter plate.

12. The method according to claim 10, wherein the shot region includes a plurality of chip regions and a scribe line region configured to separate the plurality of chip regions from each other, and
a preceding exposure portion serves as at least a portion of at least one chip region of the plurality of chip regions.

13. The method according to claim 10, wherein irradiating the part out of the whole of the imprint material with the light that has passed through the first passing portion increases the viscoelasticity of the part out of the whole of the imprint material.

14. The method according to claim 10, wherein irradiating the part out of the whole of the imprint material with the light that has passed through the first passing portion increases the viscoelasticity of the part out of the whole of the imprint material, and
irradiating the whole of the imprint material with the light that has passed through the second passing portion cures the whole of the imprint material.

15. A method of manufacturing an article, the method comprising:
forming a pattern on a substrate by using an imprint apparatus defined in claim 1; and
performing a process for the substrate on which the pattern has been formed in the forming,
wherein the article is manufactured from the substrate on which the process has been performed.

16. A method of manufacturing an article, the method comprising:
forming a pattern on a substrate by an imprint method defined in claim 10; and
performing a process for the substrate on which the pattern has been formed in the forming,
wherein the article is manufactured from the substrate on which the process has been performed.

* * * * *